(12) United States Patent
Ceglia et al.

(10) Patent No.: US 8,868,384 B2
(45) Date of Patent: Oct. 21, 2014

(54) METHODS AND APPARATUS FOR MONITORING OPERATION OF A SYSTEM ASSET

(75) Inventors: Kenneth Paul Ceglia, Gardnerville, NV (US); Scott Terrell Williams, Minden, NV (US); Charles Terrance Hatch, Gardnerville, NV (US); David Michael Robertson, Genoa, NV (US)

(73) Assignee: General Electric Company, Schenectady, NY (US)

( * ) Notice: Subject to any disclaimer, the term of this patent is extended or adjusted under 35 U.S.C. 154(b) by 301 days.

(21) Appl. No.: 13/421,553

(22) Filed: Mar. 15, 2012

(65) Prior Publication Data
US 2013/0246026 A1 Sep. 19, 2013

(51) Int. Cl.
*G06F 17/50* (2006.01)

(52) U.S. Cl.
USPC .................... 703/2; 703/6; 345/625; 345/630

(58) Field of Classification Search
USPC .............. 703/2, 6, 13; 386/278; 345/625, 630
See application file for complete search history.

(56) References Cited

U.S. PATENT DOCUMENTS

| 5,590,062 | A | 12/1996 | Nagamitsu et al. |
| 7,567,844 | B2 | 7/2009 | Thomas et al. |
| 7,676,294 | B2 | 3/2010 | Baier et al. |
| 8,026,933 | B2 | 9/2011 | Baier et al. |
| 2002/0029134 | A1 | 3/2002 | Friedrich |
| 2002/0161940 | A1 | 10/2002 | Eryurek |
| 2005/0228806 | A1* | 10/2005 | Haberman .................... 707/100 |
| 2007/0075995 | A1 | 4/2007 | Reichard |
| 2007/0101375 | A1* | 5/2007 | Haberman ...................... 725/86 |
| 2007/0179645 | A1 | 8/2007 | Nixon |
| 2008/0062167 | A1 | 3/2008 | Boggs et al. |
| 2009/0268029 | A1 | 10/2009 | Haussmann et al. |
| 2009/0319058 | A1 | 12/2009 | Rovaglio et al. |
| 2010/0257464 | A1 | 10/2010 | Renner |
| 2011/0075257 | A1 | 3/2011 | Hua et al. |
| 2011/0246555 | A1* | 10/2011 | Hedges ......................... 709/203 |
| 2011/0246900 | A1* | 10/2011 | Hedges ......................... 715/738 |
| 2013/0156404 | A1* | 6/2013 | Lahr et al. ..................... 386/278 |
| 2013/0246037 | A1* | 9/2013 | Ceglia et al. .................... 703/13 |

OTHER PUBLICATIONS

Search Report and Written Opinion from corresponding EP Application No. 13158460, dated Jul. 16, 2013.

* cited by examiner

*Primary Examiner* — Thai Phan
(74) *Attorney, Agent, or Firm* — Fletcher Yoder, P.C.

(57) ABSTRACT

A device for monitoring operation of a plurality of system assets includes a storage device configured to store a model of a plurality of system assets, wherein the model includes a plurality of asset images associated with the system assets, and a plurality of component connections representative of a plurality of conduits coupled to the system assets. The device also includes a processor coupled to the storage device. The processor is configured to display the plurality of asset images and to display the plurality of component connections. The processor is also configured to select an asset image, display a status of a system asset associated with the selected asset image, and automatically display a representation of at least one of a process flow entering the system asset and a process flow exiting the system asset when the asset image is selected.

20 Claims, 4 Drawing Sheets

METHODS AND APPARATUS FOR MONITORING OPERATION OF A SYSTEM ASSET

BACKGROUND OF THE INVENTION

The present application relates generally to power systems and, more particularly, to methods and apparatus for use in monitoring operation of a system asset.

At least some known power systems include a plurality of components, such as generators, motors, fans, and/or other components. Such components are often stored or positioned within a building such as a power plant or a factory. A building may house a large enough number of components that it may be difficult for a user to locate desired components and/or navigate to desired components. For example, a desired component may be positioned behind and/or may be obscured by another component such that the desired component is not easily seen.

Moreover, during operation of the power system, one or more components may experience a failure, and/or may operate outside of predefined boundaries. Such a component may enter an alarm state to alert a user to the failure or the unacceptable operating conditions.

To monitor system components, at least some known systems are modeled using virtual representations of the system components. Such models may include representations of the system components and may display a status of the components. Although useful, generally such models may not enable a user to navigate through the system model in a virtual environment, and/or may not enable a user to efficiently view the process flow through a plurality of interconnected system components. As such, the reliability and effectiveness of such system models in monitoring system components may be limited.

BRIEF DESCRIPTION OF THE INVENTION

In one embodiment, a device for monitoring operation of a plurality of system assets is provided that includes a storage device configured to store a model of a plurality of system assets, wherein the model includes a plurality of asset images associated with the system assets, and a plurality of component connections representative of a plurality of conduits coupled to the system assets. The device also includes a processor coupled to the storage device. The processor is configured to display the plurality of asset images and to display the plurality of component connections. The processor is also configured to select an asset image, display a status of a system asset associated with the selected asset image, and automatically display a representation of at least one of a process flow entering the system asset and a process flow exiting the system asset when the asset image is selected.

In another embodiment, a system is provided that includes a data acquisition device for determining a status of a plurality of system assets, and a computing device coupled to the data acquisition device. The computing device includes a storage device configured to store a model of a plurality of system assets, wherein the model includes a plurality of asset images associated with the plurality of system assets and a plurality of component connections representative of a plurality of conduits coupled to the plurality of system assets. The computing device also includes a processor coupled to the storage device. The processor is configured to display the plurality of asset images and to display the plurality of component connections. The processor is also configured to select an asset image of the plurality of asset images, display the status of a system asset associated with the selected asset image, and automatically display a representation of at least one of a process flow entering the system asset and a process flow exiting the system asset when the asset image is selected.

In yet another embodiment, a method of monitoring operation of a plurality of system assets is provided that includes receiving data representative of a status of a plurality of system assets and displaying a model of the plurality of system assets. The model includes a plurality of asset images, and each asset image is representative of a system asset of the plurality of system assets. A plurality of component connections are displayed on the display, wherein each component connection is representative of a conduit coupled to at least one system asset of the plurality of system assets. The method also includes selecting an asset image of the plurality of asset images, displaying the status of a system asset associated with the selected asset image, and automatically displaying a representation of at least one of a process flow entering the system asset and a process flow exiting the system asset when the asset image is selected.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
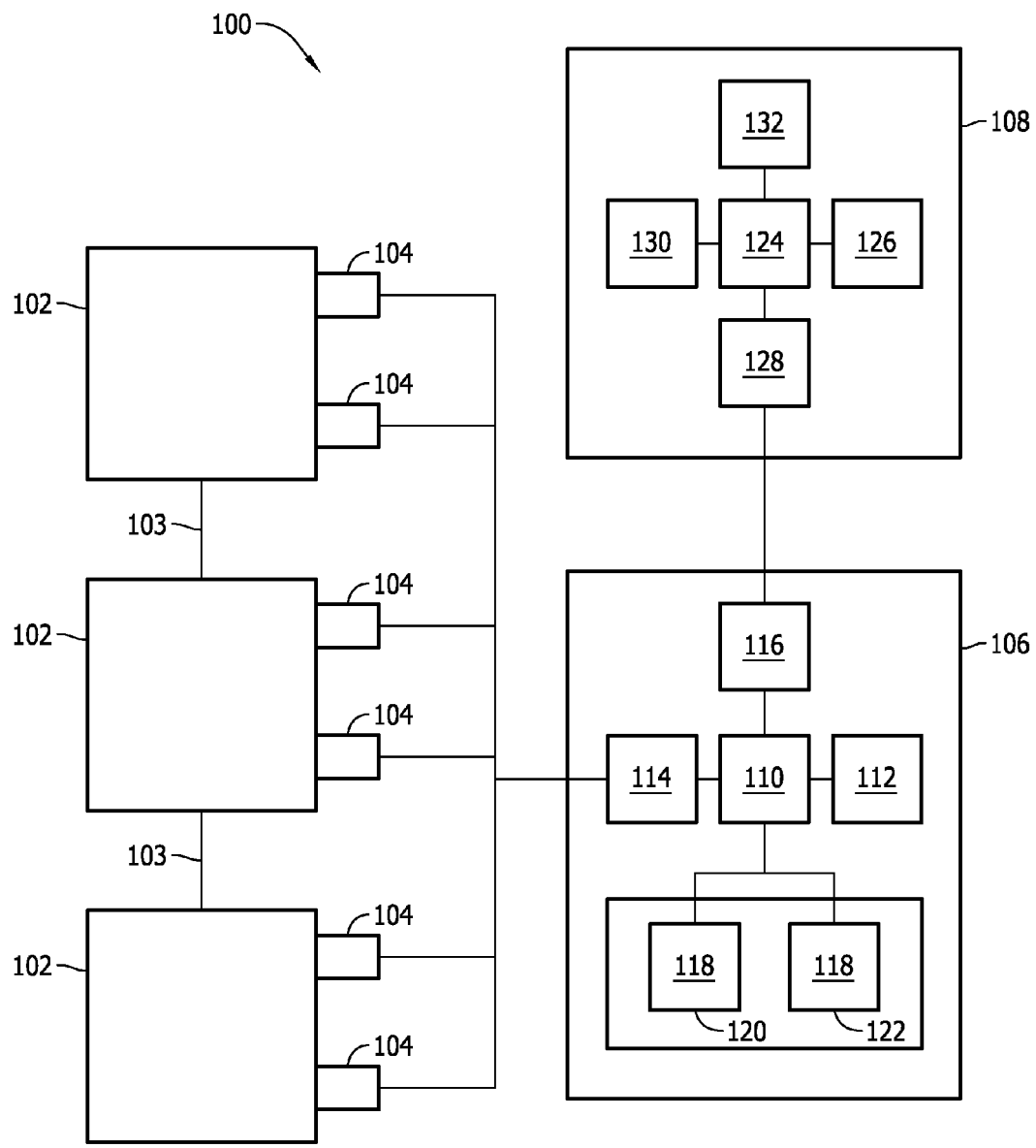
FIG. 1 is a block diagram of an exemplary system including a plurality of system assets.

FIG. 1 is a block diagram of an exemplary system 100 that includes a plurality of system assets 102. In the exemplary embodiment, system 100 may be, or may include, a factory, an industrial system or facility, a mill, a refinery, a manufacturing facility, a power generation plant or facility, and/or any other system that includes a plurality of system assets 102. System assets 102 may include, but are not limited to only including, machines, motors, generators, pumps, fans, computer systems or devices, sensors, and/or any other device or machine that enables system 100 to function as described herein.

System assets 102 may be coupled together, for example, via one or more conduits 103 that facilitate channeling process flow between assets 102. For example, conduits 103 may include one or more pipes, cables, wires, mechanical drive or coupling systems, and/or other connectors that enable process flow to be channeled between system assets 102. Process flow may include combustion gases, steam, hydraulic fluid, water, fuel, electricity (e.g., a power output and/or a power consumption of an asset 102), and/or any other output from system assets 102 and/or input into system assets 102 that enables system 100 to function as described herein.

In the exemplary embodiment, at least one sensor 104 is coupled to at least one system asset 102 for use in measuring and/or monitoring an operating condition of asset 102. For example, if asset 102 is a rotating machine, sensors 104 may measure a vibration of a drive shaft of the machine, a rotational frequency or speed of the drive shaft, a temperature of the machine, an operating pressure within the machine, and/or any other operating condition of any component or device that enables system 100 to function as described herein. Moreover, sensors 104 may be coupled to conduits 103 to measure and/or monitor conduits 103 and/or process flow channeled through conduits 103.

System 100 also includes at least one data acquisition device 106 and at least one computing device 108 that is coupled to data acquisition device 106. In the exemplary embodiment, data acquisition device 106 includes a processor 110 coupled to one or more memory devices 112, a sensor interface 114, a communication interface 116, and one or more databases 118.

Processor 110 includes any suitable programmable circuit including one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The above examples are exemplary only, and thus are not intended to limit in any way the definition and/or meaning of the term "processor."

In the exemplary embodiment, memory device 112 is a storage device that includes a computer readable storage medium, such as, without limitation, random access memory (RAM), flash memory, a hard disk drive, a solid state drive, a diskette, a flash drive, a compact disc, a digital video disc, and/or any suitable memory. In the exemplary embodiment, memory device 112 includes data and/or instructions that are executable by processor 110 (i.e., processor 110 is programmed by the instructions) to enable processor 110 to perform the functions described herein.

Sensor interface 114 is coupled to sensors 104 for receiving signals representative of measured operating conditions of assets 102. More specifically, sensor interface 114 receives signals from sensors 104 via a wireless connection and/or via a wired connection to sensors 104. In the exemplary embodiment, sensor interface 114 converts and/or adjusts the signals received from sensors 104 for use with processor 110. In one embodiment, sensor interface 114 includes an analog-to-digital converter (ADC) that converts analog signals received from sensors 104 to digital data representative of the measured operating conditions (hereinafter referred to as "asset measurement data"), and the asset measurement data is transmitted to processor 110. In the exemplary embodiment, data acquisition device 106 determines a status of each system asset 102 based on the asset measurement data received.

Communication interface 116 may include, without limitation, a network interface controller (NIC), a network adapter, a transceiver, or any other communication interface or device that enables data acquisition device 106 to operate as described herein. In the exemplary embodiment, communication interface 116 may connect to computing device 108 using any suitable wired or wireless network and/or communication protocol.

In the exemplary embodiment, databases 118 include a measurement database 120 and a model database 122. Alternatively, databases 118 may include any other database, and/or measurement database 120 and model database 122 may be combined into a single database 118. In one embodiment, databases 118 are included within one or more memory devices 112. Alternatively, databases 118 are included within one or more remote storage devices, such as a network attached storage (NAS) device, an external hard drive, a remote computing device, and/or any other storage device that enables data acquisition device 106 to function as described herein.

In the exemplary embodiment, processor 110 stores asset measurement data received from sensors 104 in measurement database 120. In one embodiment, measurement database 120 stores historical asset measurement data for each asset 102 during a predefined period of time. Moreover, processor 110 (or another device) stores components of a model (not shown in FIG. 1) of system 100 and/or system assets 102 in model database 122. In the exemplary embodiment, the model components include data associated with each system asset 102. For example, the model components may include an image or a graphical representation of each asset 102, a location of each asset 102, an identifier for each asset 102, one or more connections to other assets 102, operating condition thresholds and/or alarm thresholds for each asset 102, and/or any other data associated with system assets 102. In one embodiment, a user or an administrator may input the model components into model database 122 for use in creating a model of system 100. As used herein, the term "model" refers to a visual representation of a system or a component. For example, the model may be a computer-based representation that displays a graphical indicator representing a type, identity, location, and/or any other characteristic of the system or component.

In the exemplary embodiment, computing device 108 is coupled to data acquisition device 106 for receiving data from data acquisition device 106 and/or displaying a model of system 100. Computing device 108 includes a processor 124 coupled to a memory device 126, a communication interface 128, a user input device 130, and a display 132. In the exemplary embodiment, computing device 108 is a mobile device, such as a laptop, a smartphone, a personal digital assistant (PDA), a tablet computer, and/or any other device that functions as described herein. Alternatively, computing device 108 is a desktop computer, a server computer, and/or any other computing device that enables system 100 to function as described herein.

Processor 124 includes any suitable programmable circuit including one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The above examples are exemplary only, and thus are not intended to limit in any way the definition and/or meaning of the term "processor."

Memory device 126 includes a computer readable storage medium, such as, without limitation, random access memory (RAM), flash memory, a hard disk drive, a solid state drive, a diskette, a flash drive, a compact disc, a digital video disc, and/or any suitable memory. In the exemplary embodiment, memory device 126 includes data and/or instructions that are executable by processor 124 (i.e., processor 124 is programmed by the instructions) to enable processor 124 to perform the functions described herein.

Communication interface 128 may include, without limitation, a network interface controller (NIC), a network adapter, a transceiver, or any other communication interface or device that enables computing device 108 to operate as described herein. In the exemplary embodiment, communication interface 128 may connect to data acquisition device 106 using any suitable wired or wireless network and/or communication protocol.

User input device 130 includes, without limitation, a keyboard, a keypad, a touch-sensitive screen, a mouse, a scroll wheel, a pointing device, an audio input device employing speech-recognition software, and/or any suitable device that enables a user to input data into computing device 108 and/or retrieve data from computing device 108. Display 132 includes, without limitation, a liquid crystal display (LCD), a vacuum fluorescent display (VFD), a cathode ray tube (CRT), a plasma display, a light-emitting diode (LED) display, one or more LEDs, and/or any suitable visual output device capable of displaying graphical data and text to a user. In one embodiment, display 132 may be a touch-sensitive screen that incorporates aspects of user input device 130, for example, by enabling a user to input data and/or commands through the screen.

During operation, sensor interface 114 of data acquisition device 106 receives sensor measurement signals from sensors 104 and converts the signals into asset measurement data that is stored (by processor 110) in measurement database 120. Data acquisition device 106 also receives or generates a plurality of model components representative of one or more aspects of system assets 102, and stores the model components in model database 122. The model components and asset measurement data are transmitted to computing device 108 via communication interface 116.

In the exemplary embodiment, computing device 108 receives the model components and asset measurement data from data acquisition device 106 and stores the components and data (and/or a cached version of the components and/or data) in memory device 126. Processor 124 retrieves the model components and asset measurement data from memory device 126 and displays the model of system 100 on display 132 based on the model components and/or asset measurement data.

Figure 2:
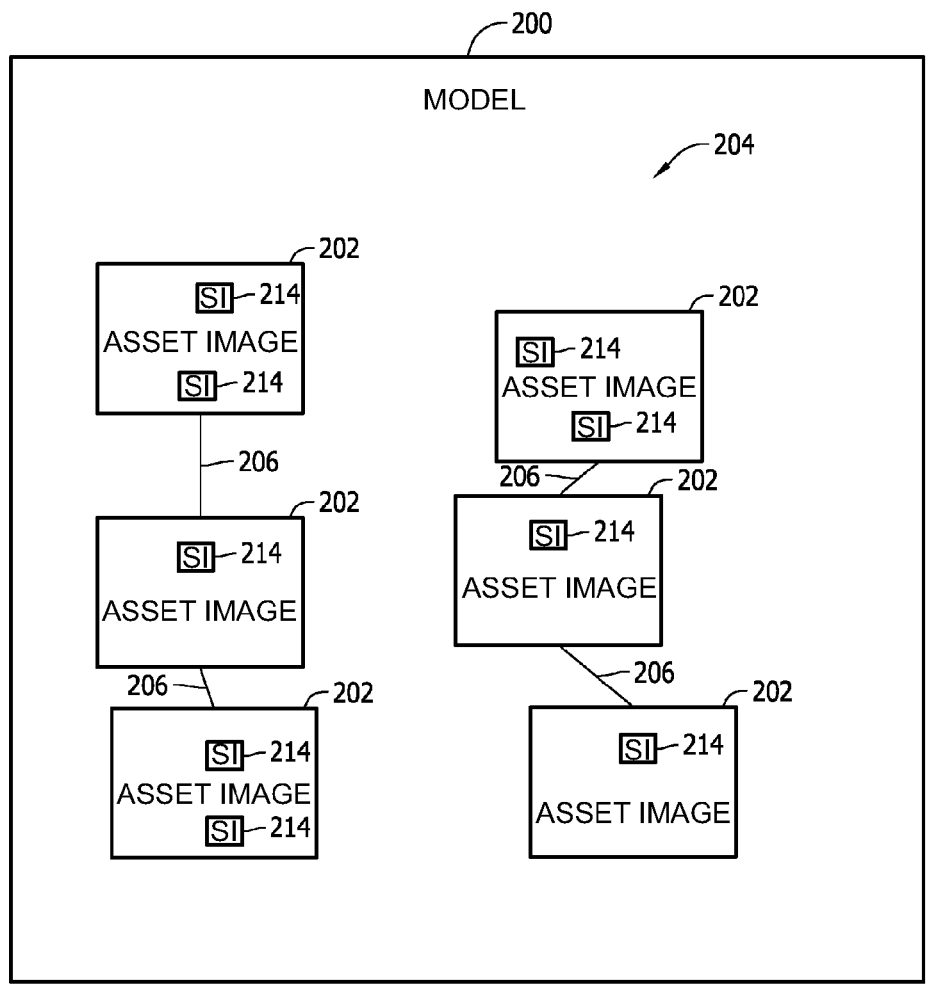
FIG. 2 is a block diagram of an exemplary two-dimensional view of a model of the system shown in FIG. 1.
Figure 3:
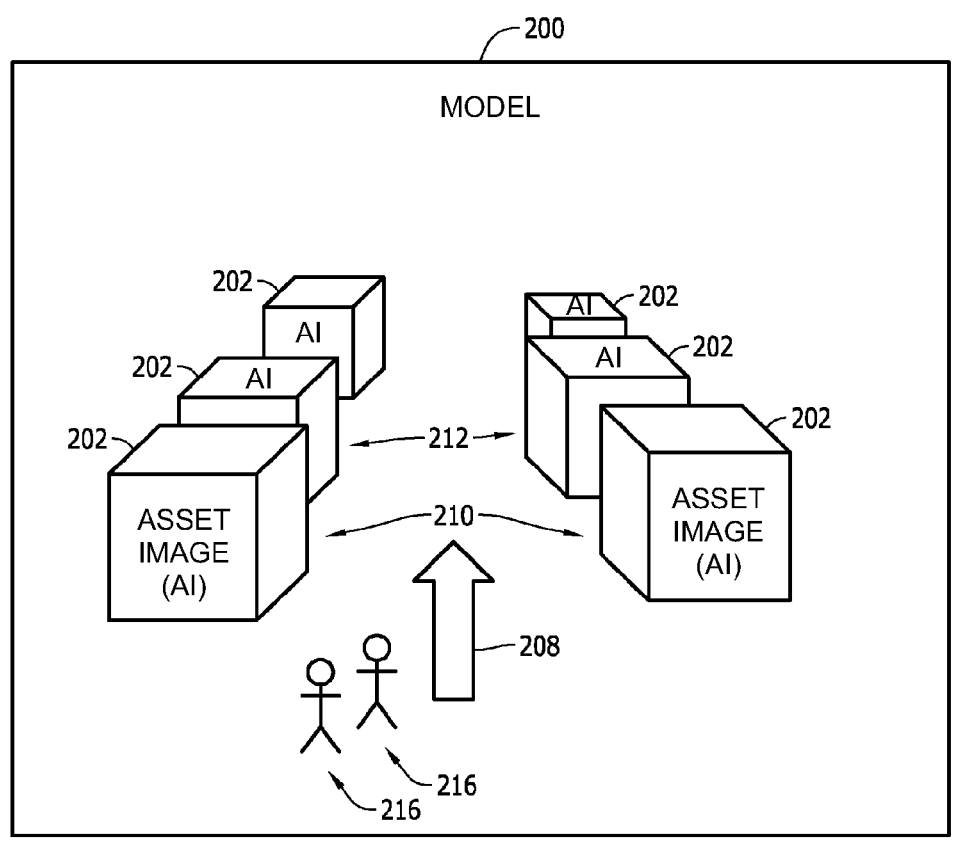
FIG. 3 is a block diagram of an exemplary three-dimensional view of the model of the system shown in FIG. 1.

FIG. 2 is a block diagram of an exemplary graphical representation or model 200 of a system, such as system 100 (shown in FIG. 1). More specifically, FIG. 2 illustrates a two-dimensional (2D) view, such as a top view, of model 200. FIG. 3 is a block diagram illustrating a three-dimensional (3D) view of model 200. For example, model 200 may be a stereoscopic 3D display of asset images 202 that enables a user to view a virtual representation of system 100 on display 132.

In the exemplary embodiment, model 200 is generated (e.g., by processor 124 (shown in FIG. 1)) from components and/or data stored within memory device 126 and/or displayed by display 132 of computing device 108 (shown in FIG. 1). Alternatively or additionally, model 200 may be stored within, and/or displayed by, at least one device or system remote from computing device 108, such as data acquisition device 106.

In the exemplary embodiment, model 200 displays a representation or image (hereinafter referred to as an "asset image 202") of at least one system asset 102 (shown in FIG. 1) on display 132. Moreover, model 200 displays a location 204 or relative position of each system asset 102 within model 200, for example, by positioning each asset image 202 within model 200 at a location 204 corresponding to system asset 102 associated with asset image 202. Accordingly, a position of each asset image 202 within model 200 corresponds to a relative position, within system 100, of each system asset 102 associated with, or represented by, asset image 202.

In the exemplary embodiment, model 200 is generated by mapping each system asset 102 with a physical location. For example, a user may use a global positioning satellite (GPS) enabled camera and/or another device to identify a physical location of system asset 102, and to automatically and/or to manually associate the physical location of system asset 102 with an associated asset image 202 within model 200. In addition, data associated with system asset 102, such as asset measurement data, operating conditions, process parameters, a status of asset 102, and/or any other details, may be associated with asset image 202. The data associated with each system asset 102 may be accessed and/or displayed by selecting the associated asset image 202 within model 200. For example, a user may select an asset image 202, using user input device 130, to receive data associated with system asset 102. User input device 130 generates a signal representative of the user input (i.e., representative of the selection of the asset image 202) and transmits the signal to processor 124.

Asset images 202, in the exemplary embodiment, are coupled together via one or more component connections 206 that are representative of process flow connections, such as conduits 103 (shown in FIG. 1), between system assets 102 associated with images 202. In the exemplary embodiment, when a system asset 102 is selected by a user, component connections 206 coupled to asset 102 are automatically emphasized. Moreover, a graphical representation of the process flow entering and/or exiting system asset 102 via component connections 206 may be automatically displayed, and/or data representative of characteristics of the process flow may be automatically displayed, when asset 102 is selected.

As used herein, the term "emphasize" refers to displaying one or more asset images 202, component connections 206, and/or any other portion of model 200 in a more visible or pronounced manner as compared to a display of a non-emphasized, or "normal," portion of model 200. For example, one or more asset images 202 may be emphasized by highlighting asset image 202 in a brighter or more visible color in contrast to the color of other asset images 202 within model 200, by increasing a contrast or brightness of asset image 202 with respect to other asset images 202, and/or by any other manner that enables model 200 to function as described herein.

Moreover, in the exemplary embodiment, a user may navigate through model 200 using user input device 130, for example. More specifically, processor 124 receives input from user input device 130 and enables the user to navigate through model 200 based on the input received. As used herein, the term "navigate" refers to moving a frame of reference and/or a virtual location of the user within model 200 (e.g., to simulate movement of the user within model 200) such that different views of asset images 202 are presented to the user. For example, the user may access user input device 130 to virtually move within model 200 in a direction 208 that enables the user to move past a first set 210 of asset images 202 such that a second set 212 of asset images 202 is more clearly in view.

Alternatively, the user may navigate, or virtually move, within model 200 based on data indicative of a location of the user with respect to a relative location of system assets 102. More specifically, processor 124 receives location data from a location-aware device, such as a global positioning satellite (GPS) device (not shown), that indicates the relative location of the user within system 100 and/or with respect to the locations of system assets 102. Processor 124 associates the location data received with a virtual location of the user in model 200. Processor 124 may display asset images 202 to the user in accordance with a frame of reference that is based on the virtual location of the user within model 200.

In one embodiment, processor 124 adjusts an asset image 202 to graphically display an operational status of system asset 102 associated with image 202. In one embodiment, processor 124 may cause asset image 202 to move back and forth, i.e., a type of oscillation, to display a vibration of system asset 102. Processor 124 may increase the rate of movement of asset image 202 if the vibration of system asset 102 increases, and may decrease the rate of movement of asset image 202 if the vibration of system asset 102 decreases. In another embodiment, processor 124 may adjust asset image 202 by displaying asset image 202 in a color representative of a temperature of system asset 102. Processor 124 may increase a brightness, depth, saturation, and/or hue of the color, and/or may change any other characteristic of the color if the temperature increases, and may decrease the brightness, depth, saturation, and/or hue of the color, and/or may change any other characteristic of the color if the temperature of system asset 102 decreases.

Moreover, in the exemplary embodiment, processor 124 displays a location of a plurality of sensors 104 (shown in FIG. 1) within model 200 using a plurality of sensor images 214. Accordingly, the location of each sensor image 214 within model 200 corresponds to a location of each associated sensor 104 within system 100.

In one embodiment, a plurality of users may access and/or interact with model 200 and/or asset images 202. For example, model 200 may represent a virtual reality environment in which a plurality of technicians and/or other users may collaborate and/or troubleshoot issues relating to system assets 102 represented within model 200. Each user may access model 200 through a network connection. Moreover, each user may be represented within model 200 by a user image 216, and each user may interact with every other user within model 200. Users may also interact with system assets 102 by selecting, or virtually accessing, asset images 202 associated with system assets 102. As used herein, the term "virtually accessing" refers to controlling user image 216 such that a portion of image 216, such as a representation of a user's hand, contacts asset image 202 within model 200. For example, a first user may select an asset image 202 by virtually accessing asset image 202, and the status of system asset 102 represented by asset image 202 may be displayed within model 200 such that each user may view the displayed status.

Moreover, one or more images and/or video feeds, may be incorporated within model 200 and/or may be linked to model 200. For example, a user may select an asset image 202 to display images and/or video captured by one or more cameras (not shown) positioned to record system asset 102 associated with asset image 202.

Figure 4:
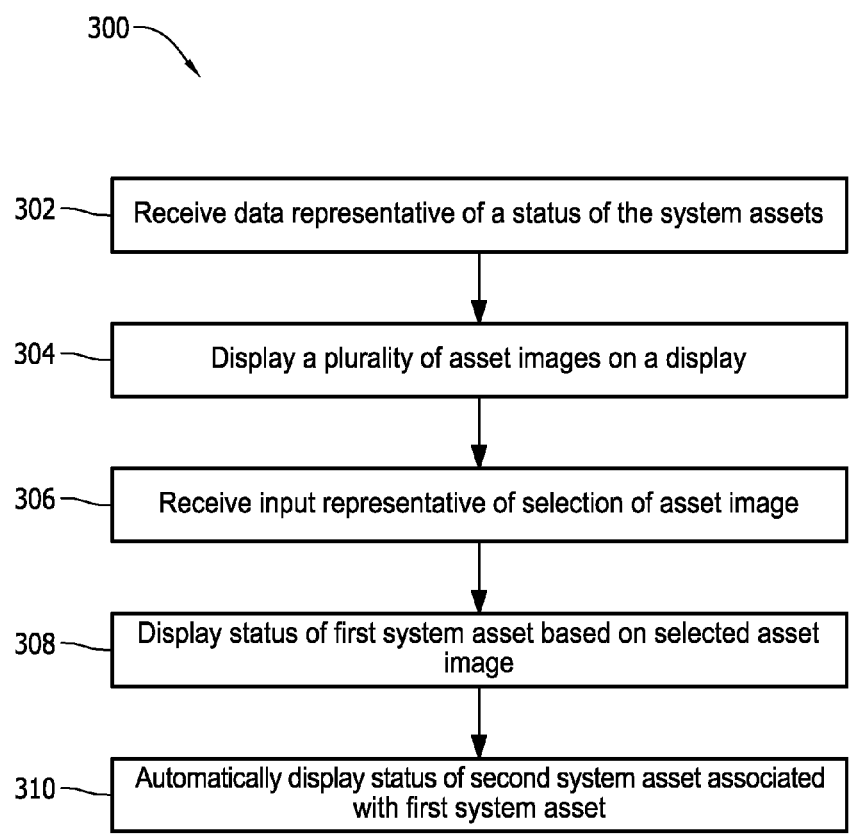
FIG. 4 is a flow diagram of an exemplary method that may be implemented to monitor the operation of a plurality of system assets used with the system shown in FIG. 1.

FIG. 4 is a flow diagram of an exemplary method 300 that may be implemented to monitor operation of a plurality of assets of a system, such as system assets 102 of system 100 (both shown in FIG. 1). In the exemplary embodiment, method 300 is embodied within a plurality of computer-executable instructions stored within memory device 126 of computing device 108 (both shown in FIG. 1), and is executed by processor 124 (shown in FIG. 1) of computing device 108.

In the exemplary embodiment, a model (such as model 200 shown in FIG. 2) that is representative of a plurality of system assets 102 is stored in memory device 126. Data representative of a status and/or asset measurement data of each system asset 102 is received 302, for example, from data acquisition device 106 (shown in FIG. 1) and the data is stored in memory device 126.

A plurality of asset images 202 (shown in FIG. 2) are displayed 304 on a display, such as display 132 (shown in FIG. 1). Each asset image 202, in the exemplary embodiment, is representative of a system asset 102. Accordingly, each asset image 202 represents a relative location of system asset 102 within system 100, and may be selected to receive data associated with system asset 102, such as asset management data, a status, and/or any other data associated with asset 102.

In the exemplary embodiment, an input representative of a selection of an asset image 202 is received 306, for example, through user input device 130. More specifically, a user may manipulate user input device 130 to select an asset image 202 within model 200, and the input is transmitted to processor 124. Processor 124 displays 308 a status of a system asset 102, and/or other data associated with asset 102, based on selected asset image 202.

In the exemplary embodiment, processor 124 determines which system asset 102 is represented by selected asset image 202. More specifically, in the exemplary embodiment, processor 124 determines that a first system asset 102 is associated with selected asset image 202, and displays 308 the status of first system asset 102 on display 132 (shown in FIG. 1). Moreover, processor 124 automatically displays 310 a status of a second system asset 102 associated with first system asset 102, and/or any other data associated with second system asset 102. In the exemplary embodiment, second system asset 102 is coupled to first system asset 102, for example, by a conduit 103. Processor 124 may also automatically display the process flow through conduit 103 when asset image 202 associated with first system asset 102 is selected.

A technical effect of the apparatus, systems, and methods described herein includes at least one of (a) receiving data representative of a status of a plurality of system assets; (b) displaying a model of the plurality of system assets on a display, the model including a plurality of asset images, wherein each asset image of the plurality of asset images is representative of a system asset; (c) displaying a plurality of component connections on a display, wherein each component connection is representative of a conduit coupled to at least one system asset; (e) selecting an asset image of a plurality of asset images; (f) displaying a status of a system asset associated with a selected asset image; and (g) automatically displaying a representation of at least one of a process flow entering a system asset and a process flow exiting the system asset when an asset image is selected.

The system described herein efficiently and robustly displays status information for a plurality of system assets. A model of the system assets is provided and displayed on a display. A plurality of asset images is included within the model, and each asset image represents a system asset. A plurality of conduits coupled to the system assets are represented within the model as a plurality of component connections. A user may select an asset image to obtain a status and/or other data of the system asset associated with the asset image. When the asset image is selected, the process flow entering the system asset and/or the process flow exiting the system asset is displayed within the model. Accordingly, a user may quickly and efficiently obtain information for the system assets in the system, thus facilitating troubleshooting and analysis of the system.

Exemplary embodiments of systems, methods, and apparatus for use in monitoring operation of a plurality of system assets are described above in detail. The systems, methods, and apparatus are not limited to the specific embodiments described herein, but rather, components of the apparatus and/or systems, and/or steps of the methods may be utilized independently and separately from other components and/or steps described herein. For example, the computing device described herein may also be used in combination with other systems and methods, and is not limited to practice with only the system or the data acquisition device as described herein. Rather, the exemplary embodiment can be implemented and utilized in connection with many other power system or industrial applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A device for use in monitoring operation of a plurality of system assets, said device comprising:
   a storage device configured to store a model of a plurality of system assets, wherein the model includes:
      a plurality of asset images associated with the plurality of system assets; and
      a plurality of component connections representative of a plurality of conduits coupled to the plurality of system assets; and
   a processor coupled to said storage device and configured to:
      display the plurality of asset images;
      display the plurality of component connections;
      select an asset image of the plurality of asset images;
      display a status of a system asset associated with the selected asset image; and
      automatically display a representation of at least one of a process flow entering the system asset and a process flow exiting the system asset when the asset image is selected.

2. A device in accordance with claim 1, further comprising a user input device configured to transmit a signal representative of a user input to said processor.

3. A device in accordance with claim 2, wherein said processor is further configured to enable the user to navigate through the model based on the user input signal.

4. A device in accordance with claim 1, wherein said processor is further configured to enable a user to navigate through the model based on data indicative of a location of a user with respect to a location of the plurality of system assets.

5. A device in accordance with claim 1, wherein said processor is further configured to adjust an asset image to graphically display an operational status of a system asset associated with the adjusted asset image.

6. A device in accordance with claim 1, wherein said processor is further configured to display a location of at least one sensor within the model, wherein the at least one sensor is configured to measure an operating condition of at least one system asset of the plurality of system assets.

7. A device in accordance with claim 1, wherein said processor is further configured to display, using at least one component connection of the plurality of component connections, a process flow that exits a first system asset of the plurality of system assets and that enters a second system asset of the plurality of system assets.

8. A system comprising:
   a data acquisition device for determining a status of a plurality of system assets; and
   a computing device coupled to said data acquisition device, said computing device comprising:
      a storage device configured to store a model of the plurality of system assets, wherein the model includes:
         a plurality of asset images associated with the plurality of system assets; and
         a plurality of component connections representative of a plurality of conduits coupled to the plurality of system assets; and
      a processor coupled to said storage device and configured to:
         display the plurality of asset images;
         display the plurality of component connections;
         select an asset image of the plurality of asset images;
         display the status of a system asset associated with the selected asset image; and
         automatically display a representation of at least one of a process flow entering the system asset and a process flow exiting the system asset when the asset image is selected.

9. A system in accordance with claim 8, further comprising a user input device configured to transmit a signal representative of a user input to said processor.

10. A system in accordance with claim 9, wherein said processor is further configured to enable the user to navigate through the model based on the user input signal.

11. A system in accordance with claim 8, wherein said processor is further configured to enable a user to navigate through the model based on data indicative of a location of a user with respect to a location of the plurality of system assets.

12. A system in accordance with claim 8, wherein said processor is further configured to adjust an asset image to graphically display an operational status of the system asset associated with the adjusted asset image.

13. A system in accordance with claim 8, wherein said processor is further configured to display a location of at least one sensor within the model, wherein the at least one sensor is configured to measure an operating condition of at least one system asset of the plurality of system assets.

14. A system in accordance with claim 8, wherein said processor is further configured to display, using at least one component connection of the plurality of component connections, a process flow that exits a first system asset of the plurality of system assets and that enters a second system asset of the plurality of system assets.

15. A method of monitoring operation of a plurality of system assets, said method comprising:
   receiving data representative of a status of a plurality of system assets;
   displaying a model of the plurality of system assets on a display, the model including a plurality of asset images, wherein each asset image of the plurality of asset images is representative of a system asset of the plurality of system assets;
   displaying a plurality of component connections on the display, wherein each component connection is representative of a conduit coupled to at least one system asset of the plurality of system assets;
   selecting an asset image of the plurality of asset images;
   displaying the status of a system asset associated with the selected asset image; and
   automatically displaying a representation of at least one of a process flow entering the system asset and a process flow exiting the system asset when the asset image is selected.

16. A method in accordance with claim 15, comprising selecting the asset image based on a user input.

17. A method in accordance with claim 15, further comprising navigating through the model based on a user input.

18. A method in accordance with claim 15, further comprising navigating through the model based on data indicative of a location of a user with respect to a location of the plurality of system assets.

19. A method in accordance with claim 15, further comprising displaying a location of at least one sensor within the display, wherein the at least one sensor is configured to measure an operating condition of at least one system asset of the plurality of system assets.

20. A method in accordance with claim 15, further comprising displaying, using at least one component connection of the plurality of component connections, a process flow that exits a first system asset of the plurality of system assets and that enters a second system asset of the plurality of system assets.

* * * * *